(12) United States Patent
Kanzaki et al.

(10) Patent No.: US 10,714,898 B2
(45) Date of Patent: Jul. 14, 2020

(54) SEMICONDUCTOR LIGHT EMITTING ELEMENT

(71) Applicant: HAMAMATSU PHOTONICS K.K., Hamamatsu-shi, Shizuoka (JP)

(72) Inventors: Takeshi Kanzaki, Hamamatsu (JP); Hiroki Miyachi, Hamamatsu (JP); Ryoichi Kashiro, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/377,321

(22) Filed: Apr. 8, 2019

(65) Prior Publication Data

US 2019/0319428 A1 Oct. 17, 2019

(30) Foreign Application Priority Data

Apr. 13, 2018 (JP) ................. 2018-077531

(51) Int. Cl.
*H01S 5/18* (2006.01)
*H01S 5/42* (2006.01)

(52) U.S. Cl.
CPC ............ *H01S 5/18* (2013.01); *H01S 5/42* (2013.01); *H01S 2301/18* (2013.01)

(58) Field of Classification Search
CPC ...... H01S 5/105; H01S 5/183; H01S 5/18319; H01S 5/18358; H01S 5/187; H01S 5/423; H01S 5/18; H01S 5/42; H01S 2301/18
See application file for complete search history.

(56) References Cited

FOREIGN PATENT DOCUMENTS

| JP | 3983933 B2 | 9/2007 |
|---|---|---|
| WO | WO-2014/136962 A1 | 9/2014 |
| WO | WO-2016/148075 A1 | 9/2016 |

OTHER PUBLICATIONS

Kurosaka, Yoshitaka et al., "Phase-modulating lasers toward on-chip integration," Sci. Rep. 6:30138, 2016, 7 pages.
Takiguchi, Yu et al., "Principle of beam generation in on-chip 2D beam pattern projecting lasers," Optics Express, Apr. 16, 2018, vol. 26, No. 8, pp. 10787-10800.
Hirose, Kazuyoshi et al., "Removal of surface-normal spot beam from on-chip 2D beam pattern projecting lasers," Optics Express, Nov. 12, 2018, vol. 26, No. 23, pp. 29854-29866.

*Primary Examiner* — Armando Rodriguez
(74) *Attorney, Agent, or Firm* — Faegre Drinker Biddle & Reath LLP

(57) ABSTRACT

The present semiconductor light emitting element is a semiconductor light emitting element including an active layer, an upper cladding layer and a lower cladding layer that sandwich the active layer, and a phase modulation layer optically coupled to the active layer, in which the phase modulation layer includes a basic layer and a plurality of different refractive index regions that are different in refractive index from the basic layer, and the plurality of different refractive index regions are disposed so as to form a pattern in a region outside a light line on a reciprocal lattice space in the phase modulation layer.

6 Claims, 16 Drawing Sheets

Fig.5

| | Material | Conductivity type | Thickness (nm) |
|---|---|---|---|
| Contact layer 8 | GaAs | P | 50~500 (200) |
| Upper cladding layer 7 | AlGaAs | P | $1\times10^3 \sim 3\times10^3$ ($2\times10^3$) |
| Phase modulation layer 6 (Diffraction grating layer) | Basic layer 6A: GaAs Different refractive index region 6B: AlGaAs | – | 50~200 (100) |
| Upper light guide layer 5 | Upper layer: GaAs | – | 10~200 (50) |
| | Lower layer: AlGaAs | – | 10~100 (50) |
| Active layer 4 | MQW: AlGaAs/InGaAs | P(I) | 10~100 (30) |
| Lower light guide layer 3 | AlGaAs | – | 0~300 (150) |
| Lower cladding layer 2 | AlGaAs | N | $1\times10^3 \sim 3\times10^3$ ($2\times10^3$) |
| Semiconductor substrate 1 | GaAs | N | $80\times10^3 \sim 350\times10^3$ ($150\times10^3$) |

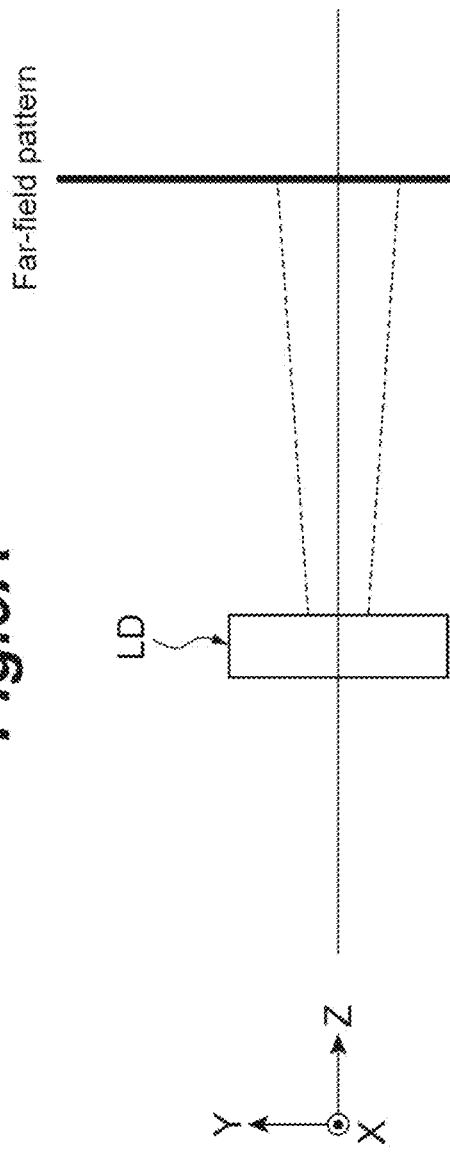
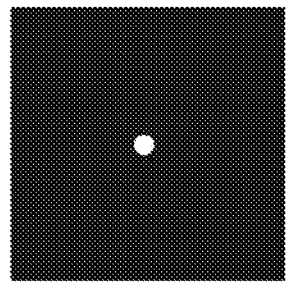
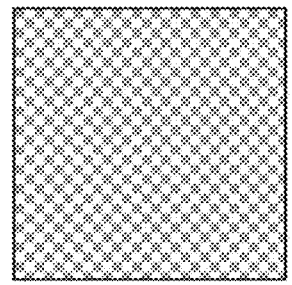
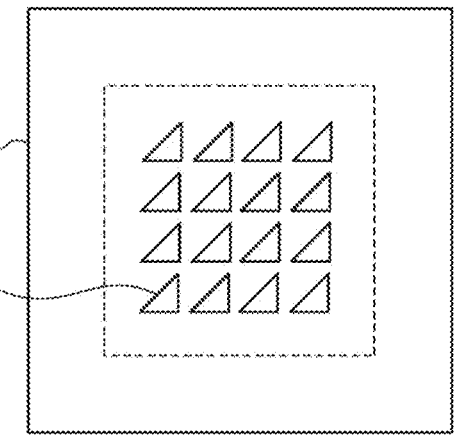

Fig.11
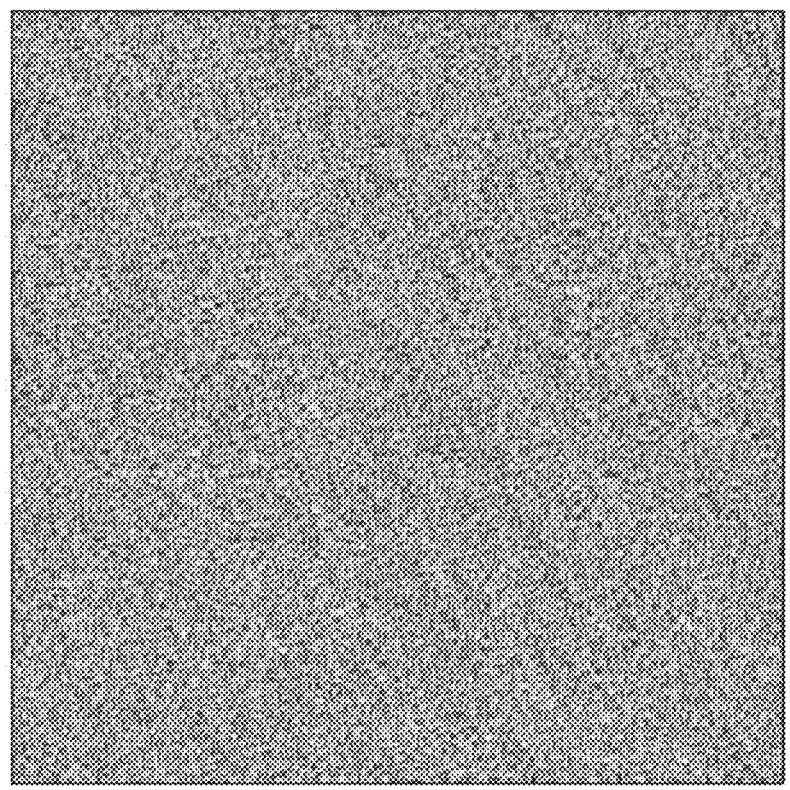

Fig. 13

Isosceles right triangle holes, electrode size of 400μm×400μm, a=284nm, drive current=10A

| | Reciprocal lattice space pattern | Shift amount | Peak output (W) | Normalized peak output |
|---|---|---|---|---|
| Comparative example (square lattice) | Non-use | r=0 | 3.3 | 1 |
| Example 1 | Character string set outside light line | r=0.002a | 6.7 | 2.03 |
| Example 2 | Character string set outside light line | r=0.005a | 6.5 | 1.97 |

*Fig.14*

Circular holes, electrode size of 400μm×400μm, a=284nm, drive current=10A

|  | Reciprocal lattice space pattern | Shift amount | Peak output (W) | Normalized peak output |
|---|---|---|---|---|
| Comparative example (square lattice) | Non-use | r=0 | 1.8 | 1 |
| Example 1 | Character string set outside light line | r=0.002a | 4.7 | 2.61 |
| Example 2 | Character string set outside light line | r=0.005a | 3.6 | 2.00 |

SEMICONDUCTOR LIGHT EMITTING ELEMENT

TECHNICAL FIELD

The present invention relates to a semiconductor light emitting element using photonic crystals.

BACKGROUND

Conventionally, semiconductor light emitting elements using photonic crystals have been known.

A semiconductor light emitting element disclosed in Patent Document 1 includes, in a unit configuration region within its photonic crystals, one first different refractive index region and one second different refractive index region provided around the first different refractive index region.

A semiconductor light emitting element disclosed in Patent Document 2 includes an active layer, a pair of cladding layers sandwiching the active layer, a phase modulation layer optically coupled to the active layer, in which the phase modulation layer includes a basic layer and a plurality of different refractive index regions that are different in refractive index from the basic layer, and when an XYZ orthogonal coordinate system taking a thickness direction of the phase modulation layer as a Z-axis direction is set and a virtual square lattice with a lattice constant a is set in an XY plane, each of the different refractive index regions is disposed so that its centroid position is shifted from a lattice point position in the virtual square lattice by a distance r, and the distance r is provided as $0<r\leq 0.3a$.

A semiconductor light emitting element disclosed in Patent Document 3 includes an active layer and a diffraction grating including differing refractive index regions periodically arranged on the active layer, and multiple diffraction gratings are indicated.

A semiconductor light emitting element disclosed in Patent Document 4 includes photonic crystals and is capable of displaying various types of beam patterns, and application to a variety of industries and displays is expected.

Patent Document 1: International Publication No. WO2014/136962
Patent Document 2: International Publication No. WO2016/148075
Patent Document 3: Japanese Patent No. 3983933
Non-Patent Document 1: Yoshitaka Kurosaka et al., "Phase-modulating lasers toward on-chip integration," Sci. Rep. 6, 30138 (2016).

SUMMARY

Conventional semiconductor light emitting elements have been expected to increase their output (light intensity). The present invention has been made in view of such problems, and an object thereof is to provide a semiconductor light emitting element capable of increasing the output.

In order to solve the problem described above, a first semiconductor light emitting element comprises an active layer, a pair of cladding layers sandwiching the active layer, and a phase modulation layer optically coupled to the active layer, wherein the phase modulation layer includes a basic layer, and a plurality of different refractive index regions that are different in refractive index from the basic layer, and when segments each connecting between centroid positions of the different refractive index regions adjacent closest to each other are defined and a smallest region enclosed by perpendicular bisectors of the segments is provided as each unit configuration region, the plurality of different refractive index regions are disposed so as to form a spreading pattern whose intensity is not 0 in a region that is inside a unit configuration region on a reciprocal lattice space in the phase modulation layer and is outside a light line.

The "light line" means a borderline on a reciprocal lattice space corresponding to a critical angle at which light generated in a semiconductor light emitting element is totally reflected when the light is output into air, and is thus not output in an upper or lower direction of the semiconductor light emitting element. Therefore, even if a pattern is formed in a region outside the "light line," no light should be output externally, and according to consideration of the present inventors, a pattern formed outside the light line was at first considered to be a completely "unnecessary pattern." However, the present inventors have confirmed that forming such an "unnecessary pattern" increases the output of the semiconductor light emitting element.

A second semiconductor light emitting element is characterized in that, when an XYZ orthogonal coordinate system taking a thickness direction of the phase modulation layer as a Z-axis direction is set and a virtual square lattice with a lattice constant a is set in an XY plane, each of the different refractive index regions is disposed so that its centroid position is shifted from a lattice point position in the virtual square lattice by a distance r, and the distance r is $0<r\leq 0.005a$. In this case, the output of the semiconductor light emitting element can increase exponentially.

A third semiconductor light emitting element is characterized in that the distance r is $0.002a\leq r$. In this case, the output of the semiconductor light emitting element can increase further exponentially.

A fourth semiconductor light emitting element is characterized in that the pattern is a far-field pattern obtained by two-dimensional Fourier transforming a two-dimensional field intensity pattern distribution on an actual space formed on a light emitting surface parallel to an XY plane in the phase modulation layer, and each of the complex amplitudes of the electromagnetic fields $f(x, y)$ of light that is obtained by two-dimensional inverse Fourier transforming the far-field pattern is, where an imaginary unit is provided as j, an amplitude term is provided as $A(x, y)$, and a phase term is provided as $P(x, y)$, given by $f(x, y)=A(x, y)\times \exp[jP(x, y)]$, segments each connecting between centroid positions of the different refractive index regions adjacent closest to each other are defined, and a smallest region enclosed by perpendicular bisectors of the segments corresponds to each unit configuration region, and in each of the unit configuration regions, an angle φ created by a segment that connects a centroid position of the different refractive index region and a lattice point position with an X-axis is, where a proportionality constant is provided as C, and a constant number is provided as B, given by $\varphi(x, y)=C\times P(x, y)+B$.

A fifth semiconductor light emitting element is characterized in that the far-field pattern is composed of a plurality of image regions at coordinates $(k_x, k_y)$ in a wave number space for which a two-dimensional field intensity pattern distribution on an actual space is subjected to two-dimensional Fourier transform, the complex amplitudes of the electromagnetic fields of light in the respective image regions are defined by $FR(k_x, k_y)$, each of the image regions providing the electromagnetic fields $FR(k_x, k_y)$ of light has a square shape, the image regions are two-dimensionally arranged so that M2 (M2 is an integer not less than 1) image regions are arrayed in a Kx-axis direction to give a normalized wave number $k_x$ in a wave number space, and in a Ky-axis direction to give a normalized wave number $k_y$, N2 (N2 is an integer not less than 1) image regions are arrayed, and the two-dimensional inverse Fourier transform to give the electromagnetic fields f(x, y) of light is given by the following formula.

$$f(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right]$$ [Formula 1]

A sixth semiconductor light emitting element is characterized in that spherical coordinates (r, θtilt, θrot) representing coordinates (x, y, z) in an XYZ orthogonal coordinate system satisfy, with use of a length r of a radius, a tilt angle θtilt of the radius from a Z-axis, and a rotation angle θrot from the X-axis of a segment for which the radius is projected onto the XY plane, the following relationship: x=r·sin θ$_{tilt}$·cos θ$_{rot}$, y=r·sin θ$_{tilt}$·sin θ$_{rot}$, and z=r·cos θ$_{tilt}$, and when a set of bright spots formed by a group of beams emitted at a tilt angle θtilt and a rotation angle θrot from the semiconductor light emitting element is provided as a far-field pattern, with the far-field pattern in a Kx-Ky plane, a normalized wave number $k_x$ on a Kx-axis and a normalized wave number $k_y$ on a Ky-axis satisfy the following relationship, where an oscillation wavelength of the semiconductor light emitting element is provided as λ.

$k_x = (a/\lambda)\cdot\sin \theta_{tilt}\cdot\cos \theta_{rot}$, and $k_y = (a/\lambda)\cdot\sin \theta_{tilt}\cdot\sin \theta_{rot}$ By the semiconductor light emitting element of the present invention, the output can be increased.

BRIEF DESCRIPTION OF THE DRAWINGS

FIG. 5 is a table showing materials, conductivity types, and thicknesses of components of the semiconductor light emitting element.

FIG. 9A, FIG. 9B, FIG. 9C and FIG. 9D include views for explaining a far-field pattern.

FIG. 11 is a view of a phase distribution of an optical image obtained by inverse Fourier transforming the pattern in FIG. 10.

FIG. 13 is a table showing peak output data (in a case of an isosceles right triangle).

FIG. 14 is a table showing peak output data (in a case of a true circle).

DETAILED DESCRIPTION

Hereinafter, a laser element (semiconductor light emitting element) according to embodiments will be explained. The same signs will be used for the same elements, and overlapping description will be omitted.

Figure 1:
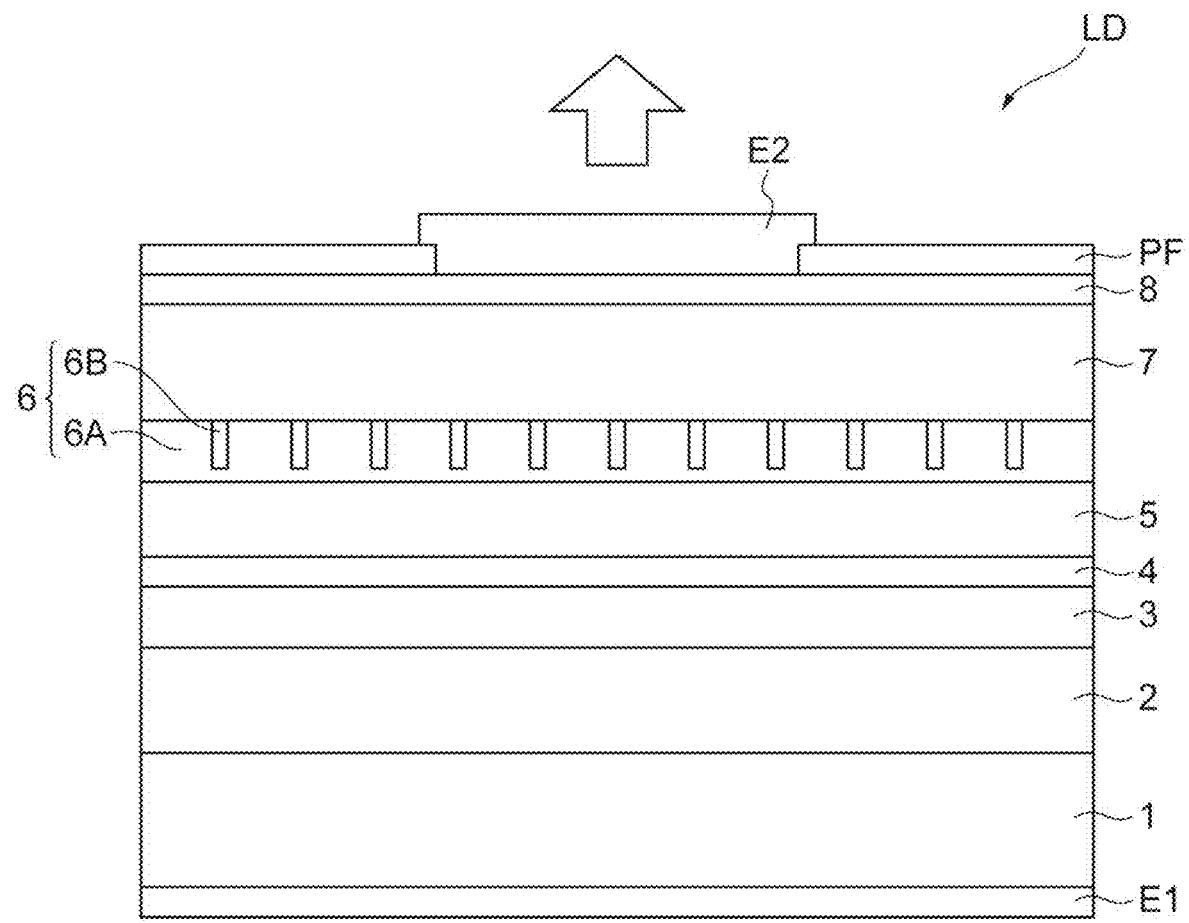
FIG. 1 is a view showing a longitudinal sectional structure of a semiconductor light emitting element.

FIG. 1 is a view showing a longitudinal sectional structure of a semiconductor light emitting element.

This semiconductor light emitting element is an element that uses a spot light of high optical intensity, and can be used for processing machines, measuring devices, medical devices, nuclear fusion devices or the like. Although the semiconductor light emitting element can be used alone, it is also possible to use multiple semiconductor light emitting elements in an arrayed arrangement.

The laser element LD selects laser light from the active layer 4 and outputs the laser light to the outside. The laser light entering into the phase modulation layer 6 forms a predetermined mode according to the lattice of the phase modulation layer inside the phase modulation layer 6, and is emitted to the outside as a laser beam having a desired pattern in a perpendicular direction from the surface of the phase modulation layer 6.

As a structure for making laser light enter into the phase modulation layer 6, besides the structure shown in the same figure, it is also possible to adopt a structure for making laser light from another laser element enter into the phase modulation layer 6 through an optical fiber or directly.

This laser element LD is a laser light source that forms standing waves in an XY in-plane direction and outputs phase-controlled plane waves in a Z-direction, and includes an active layer 4 that produces laser light, an upper cladding layer 7 and a lower cladding layer 2 that sandwich the active layer 4, and an upper light guide layer 5 and a lower light guide layer 2 that are provided between these cladding layers and sandwich the active layer 4, and there is a phase modulation layer 6 provided between the upper cladding layer 7 and the active layer 4. In the structure shown in FIG. 1, a second electrode E2 is provided in a central region of a contact layer 8.

In this structure, on a semiconductor substrate 1, the lower cladding layer 2, the lower light guide layer 3, the active layer 4, the upper light guide layer 5, the phase modulation layer 6, the upper cladding layer 7, and the contact layer 8 are stacked in sequence, a first electrode E1 is provided at a lower surface of the semiconductor substrate 1, and the second electrode E2 is provided at an upper surface of the contact layer 8. The surface of the contact layer 8 other than an electrode forming region in the surface is covered with a protective film PF made of a material such as $SiO_2$ or silicon nitride.

When a drive current is supplied between the first electrode E1 and the second electrode E2, recombination of electrons and holes occurs in the active layer 4, and the active layer 4 emits light. Carriers contributing to this light emission and the produced light are efficiently contained, by the upper light guide layer 5 and the lower light guide layer 3 and the upper cladding layer 7 and the lower cladding layer 2, between these layers.

Laser light emitted from the active layer 4 enters the interior of the phase modulation layer 6, and forms a predetermined mode. The phase modulation layer 6 includes a basic layer 6A made of a first refractive index medium and a plurality of different refractive index regions 6B that are made of a second refractive index medium different in refractive index from the first refractive index medium and exist in the basic layer 6A. The plurality of different refractive index regions 6B contain a substantially periodic structure. The laser light having entered into the phase modulation layer 6 is emitted as a laser light (shown by the arrow) to the outside perpendicularly to the substrate surface through the upper cladding layer 7, the contact layer 8, and the second electrode E2 at the top.

Where an effective refractive index of the phase modulation layer 6 is provided as n, a wavelength $\lambda_0$ (=a×n) that the phase modulation layer 6 selects is included within a light emission wavelength range of the active layer 4. The phase modulation layer (diffraction grating layer) can select the wavelength $\lambda_0$ out of light emitting wavelengths of the active layer and output the same to the outside.

Figure 2:
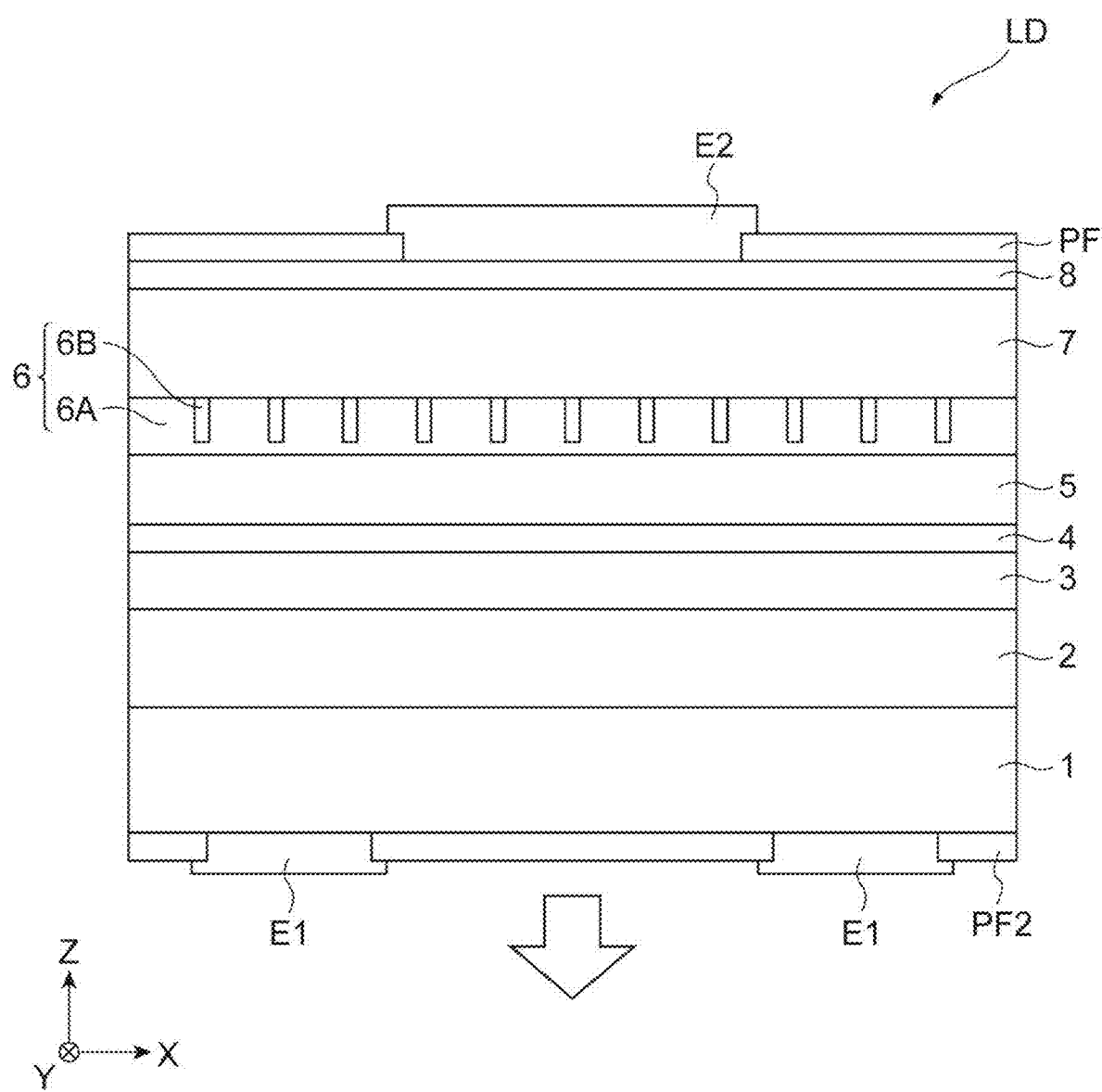
FIG. 2 is a view showing another longitudinal sectional structure of the semiconductor light emitting element.

FIG. 2 is a view showing another longitudinal sectional structure of the semiconductor light emitting element.

As shown in the same figure, when an aperture is provided in the electrode on the substrate-side surface of the laser element LD, a laser light (shown by the arrow) can be emitted from the substrate side. The first electrode E1 provided at the lower surface of the semiconductor substrate 1 is ring shaped and thus has an aperture, and a laser light produced inside the laser element can be easily emitted to the outside through the aperture. The laser light having advanced toward an upper portion of the laser element is reflected by the second electrode E2, and is output to the outside through the aperture in the first electrode E1 located at the bottom. The surface other than an electrode forming region in the lower surface of the semiconductor substrate 1 is covered with a protective film PF2 made of a material such as $SiO_2$ or silicon nitride, but the protective film PF2 may be an antireflection film.

The antireflection film is formed of a dielectric monolayer film such as silicon nitride (SiNx) and silicon dioxide ($SiO_2$) or a dielectric multilayer film. As the dielectric multilayer film, for example, a film can be used which is formed by appropriately laminating two or more types of dielectric layers selected from a group of dielectric layers including titanium oxide ($TiO_2$), silicon dioxide ($SiO_2$), silicon monoxide (SiO), niobium oxide ($Nb_2O_5$), tantalum pentoxide ($Ta_2O_5$), magnesium fluoride ($MgF_2$), titanium oxide ($TiO_2$), aluminium oxide ($Al_2O_3$), cerium oxide ($CeO_2$), indium oxide ($In_2O_3$), and zirconium oxide ($ZrO_2$). For example, in terms of an optical film thickness with respect to light having a wavelength of $\lambda$, films having a thickness of $\lambda/4$ are laminated. In addition, a reflecting film or an antireflection film may be formed by using a sputtering method.

Figure 3:
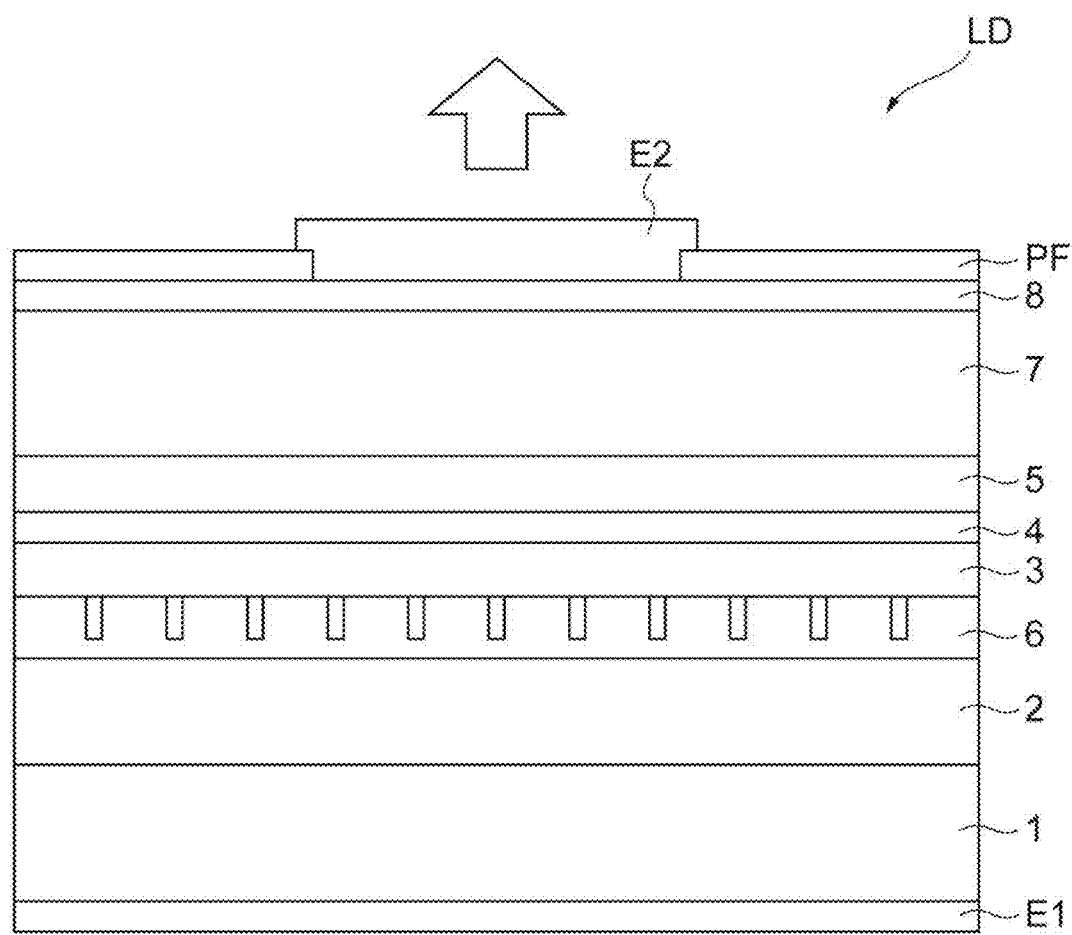
FIG. 3 is a view showing still another longitudinal sectional structure of the semiconductor light emitting element.

FIG. 3 is a view showing still another longitudinal sectional structure of the semiconductor light emitting element.

The semiconductor light emitting element of this example has a modified structure of the semiconductor light emitting element in FIG. 1, in which the phase modulation layer 6 is provided between the lower cladding layer 2 and the active layer 4, and other aspects of the structure are the same as those shown in FIG. 1. In this case, the phase modulation layer 6 can be disposed in a position to be sandwiched between the lower cladding layer 2 and the lower light guide layer 3. Also in this structure, the same operation as above is provided. Specifically, laser light emitted from the active layer 4 enters the interior of the phase modulation layer 6, and forms a predetermined mode. The laser light having entered into the phase modulation layer 6 is emitted as a laser light (shown by the arrow) in a direction perpendicular to the substrate surface through the lower light guide layer 3, the active layer 4, the upper light guide layer 5, the upper cladding layer 7, the contact layer 8, and the second electrode E2 at the top. In addition, the laser light can also be emitted with inclination from the direction perpendicular to the substrate surface.

Even when the semiconductor light emitting element has another layer structure, basically, the same effect is provided as long as the structure includes a phase modulation layer 6 and an active layer 4 between an upper cladding layer 7 and a lower cladding layer 2.

Figure 4:
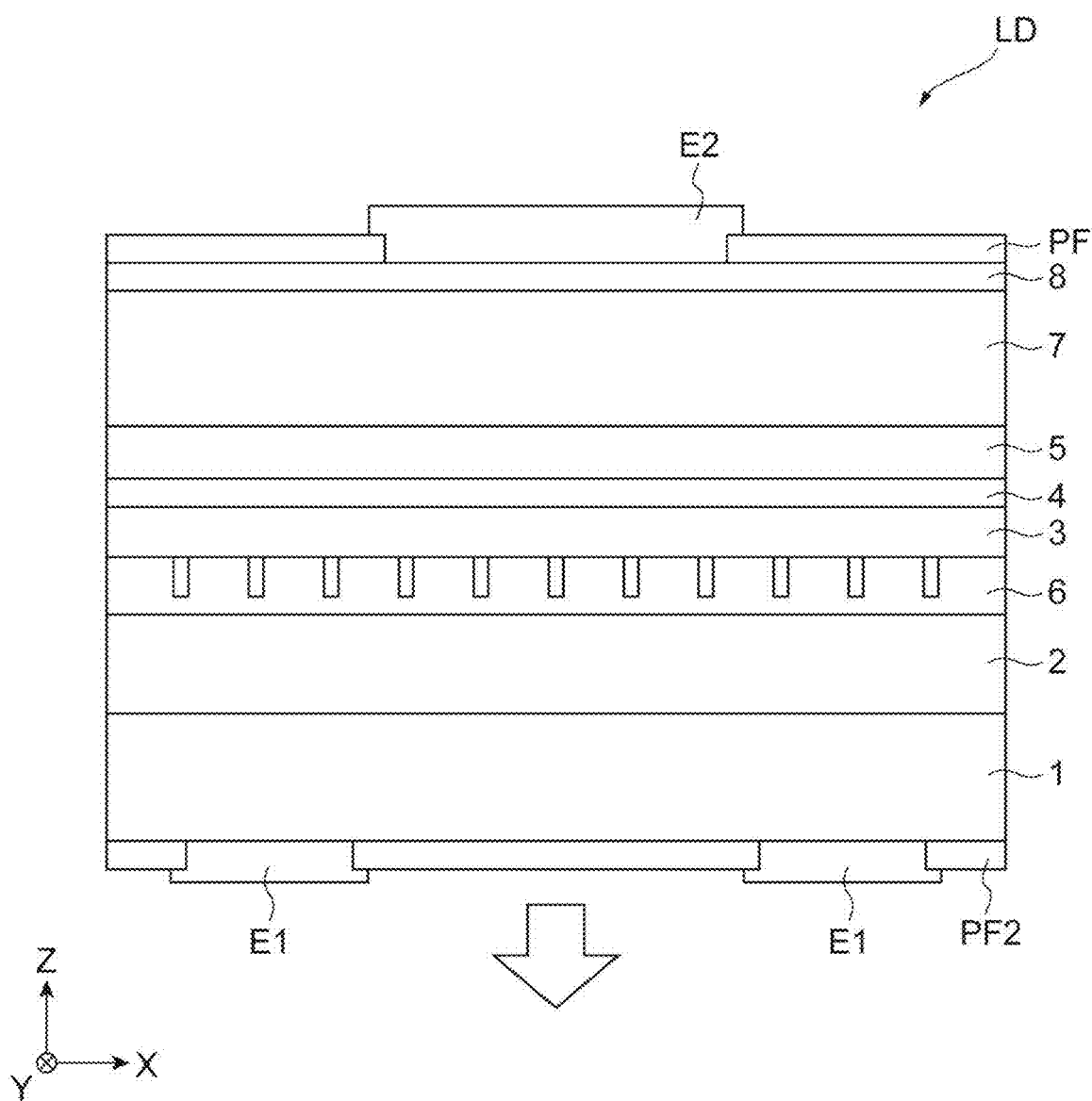
FIG. 4 is a view showing yet another longitudinal sectional structure of the semiconductor light emitting element.

FIG. 4 is a view showing yet another longitudinal sectional structure of the semiconductor light emitting element.

The semiconductor light emitting element of this example has a modified structure of the semiconductor light emitting element in FIG. 3, in which as in FIG. 2, the electrode is modified in shape, and laser light is emitted from the lower surface of the substrate. Specifically, at the lower surface of the semiconductor substrate 1, the first electrode E1 has an aperture in a region opposite the second electrode E2, so that laser light is emitted to the outside from the lower surface. The first electrode E1 provided at the lower surface of the semiconductor substrate 1 is an aperture electrode having an aperture in a central portion, and inside and around the aperture of the first electrode E1, a protective film PF2 is provided in the same manner as in the case of FIG. 2, and the protective film PF2 can be provided as an antireflection film.

In the structure described above, vacant holes are periodically formed by etching at a plurality of positions of the basic layer 6A, and the different refractive index region 6B is embedded into each of the formed vacant holes by a method of metal organic chemical vapor deposition, sputtering or epitaxy, but after embedding the different refractive index regions 6B into the holes of the basic layer 6A, further thereon, a different refractive index coating layer that is made of the same material as that of the different refractive index region 6B may be deposited.

In the device described above, the light guide layers and the like can be omitted because these are for assisting in essential actions.

FIG. 5 is a table showing a relationship of the materials, conductivity types, and thicknesses (nm) of respective compound semiconductor layers constituting the laser element.

The materials for the components of each of the laser elements described above are as shown in FIG. 5; the semiconductor substrate 1 is made of GaAs, the lower cladding layer 2 is made of AlGaAs, the lower light guide layer 3 is made of AlGaAs, the active layer 4 is formed of a multi quantum well structure MQW (barrier layer: AlGaAs, well layer: InGaAs), the upper light guide layer 5 consists of a lower layer made of AlGaAs and an upper layer made of GaAs, the basic layer 6A of the phase modulation layer (refractive index modulation layer) 6 is made of GaAs, the different refractive index regions (embedded layer) 6B embedded into the basic layer 6A are made of AlGaAs, the upper cladding layer 7 is made of AlGaAs, and the contact layer 8 is made of GaAs.

As shown in FIG. 5, each of the layers is doped with a first conductivity type (N type) impurity or a second conductivity type (P type) impurity (an impurity concentration of which is $1\times10^{17}/cm^3$ to $1\times10^{21}/cm^3$), and a region that is not intentionally doped with any impurity is intrinsic (I type). An impurity concentration of the I type is not more than $1 \times 10^{15}$/cm$^3$.

An energy bandgap of the cladding layer is set to be larger than an energy bandgap of the light guide layer, and the energy bandgap of the light guide layer is set to be larger than an energy bandgap of the well layer of the active layer 4. In AlGaAs, by changing a composition ratio of Al, the energy bandgap and the refractive index can be easily changed. In Al$_x$Ga$_{1-x}$As, when the composition ratio X of Al with a relatively small atomic radius is reduced (increased), the energy bandgap having a positive correlation with the Al composition ratio becomes smaller (larger), and when InGaAs is made by mixing In with a large atomic radius in GaAs, the energy bandgap becomes smaller. That is, the Al composition ratio of the cladding layer Al is larger than the Al composition ratio of the light guide layer, and the Al composition ratio of the light guide layer is not less than the Al composition ratio of the barrier layer (AlGaAs) of the active layer. The Al composition ratio of the cladding layer is set to 0.2 to 0.4, and in this example, set to 0.3. The Al composition ratios of the light guide layer and the barrier layer in the active layer are set to 0.1 to 0.15, and in this example, set to 0.1.

The thicknesses of the layers are as shown in FIG. 5, and the numerical ranges in the same figure represent preferable values, and the numerical values in parentheses represent optimal values. The phase of a laser light emitted as plane waves in the Z-direction from the phase modulation layer is also dependent on the characteristics of the phase modulation layer. The phase modulation layer has a thickness in the numerical range shown in FIG. 5 and therefore functions as a layer for modulating the phase.

Figure 6:
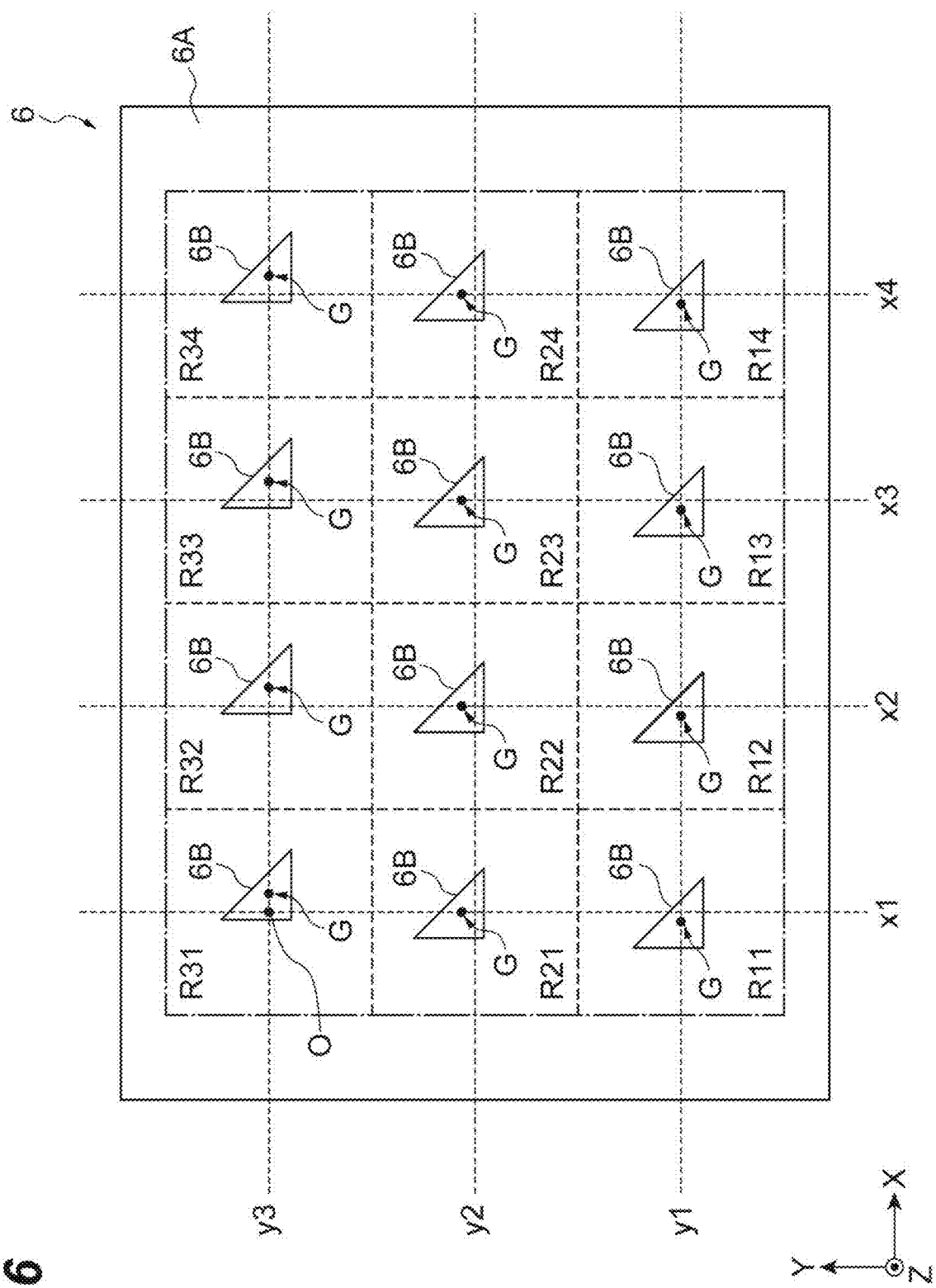
FIG. 6 is a view showing an example of a planar configuration of a phase modulation layer.

FIG. 6 is a view showing an example of a planar configuration of a phase modulation layer.

The phase modulation layer 6 consists of the basic layer 6A made of a first refractive index medium and the different refractive index regions 6B made of a second refractive index medium different in refractive index from the first refractive index medium. The different refractive index regions 6B are of a compound semiconductor, but may be vacant holes filled with argon, nitrogen, air, or the like.

In the phase modulation layer 6, a plurality of unit configuration regions R11 to R34 are two-dimensionally disposed within an XY plane including an X-axis and a Y-axis, and if XY coordinates of each of the unit configuration regions are given by a centroid position of the corresponding unit configuration region, the centroid positions are coincident with lattice points of a virtual square lattice. The XY coordinates of the unit configuration regions R11 to R34 are represented by (X, Y).

Each of the plurality of different refractive index regions 6B provided in the holes has a first area (an area S1 within the XY plane) perpendicular to a thickness direction (Z-axis). Each of the unit configuration regions R11 to R34 has only one different refractive index region 6B. In a case where the different refractive index region 6B is an isosceles right triangle, when the length of one side thereof other than the hypotenuse is provided as L, S1=L$^2$/2. A ratio of the area S1 of the different refractive index region 6B occupied in one of the unit configuration regions R11 to R34 is provided as a filling factor (FF). The area of one of the unit configuration regions R11 to R34 is equal to an area within one lattice unit of a virtual square lattice.

Here, the unit configuration regions R11 to R34 will be defined. Each of the unit configuration regions R11 to R34 is provided as that consisting of only one different refractive index region 6B. (Centroids G of) the different refractive index regions 6B in the unit configuration regions R11 to R34 are at positions shifted from each of the lattice points (provided as O) of a virtual square lattice closest to each of the different refractive index regions 6B.

An angle created by a direction toward the centroid G from the lattice point O of the virtual square lattice with the X-axis is provided as φ(x, y), and a case where the rotation angle φ coincides with a positive direction of the X-axis is represented by φ=0°. The coordinates of a centroid of the unit configuration region R11 are (x1, y1), and the coordinates of a centroid of the unit configuration region Rmn are (xm, yn) (m and n are natural numbers). At this time, a rotation angle distribution φ(x, y) has specific values for each position determined by x (=x1, x2, x3, x4 . . . ) and y (=y1, y2, y3, y4 . . . ), but is not always represented by a specific function. The rotation angle distribution φ(x, y) can be made to correspond to a phase component out of a complex amplitude distribution of the intensity of a near-field pattern of laser light. The near-field pattern subjected to Fourier transform becomes a desired far-field pattern.

FIG. 6 is a view showing an example of a planar configuration of a phase modulation layer.

When a lattice spacing of the square lattice described above is provided as a, this lattice structure has reciprocal lattice vectors that are 2π/a times primitive translation vectors. Where an effective refractive index of the phase modulation layer 6 is provided as n, a wavelength $\lambda_0$ (=a×n) that the phase modulation layer 6 selects is included within a light emission wavelength range of the active layer 4. The phase modulation layer (diffraction grating layer) can select the wavelength $\lambda_0$ out of the light emitting wavelengths of the active layer and output the same to the outside.

Figure 7:
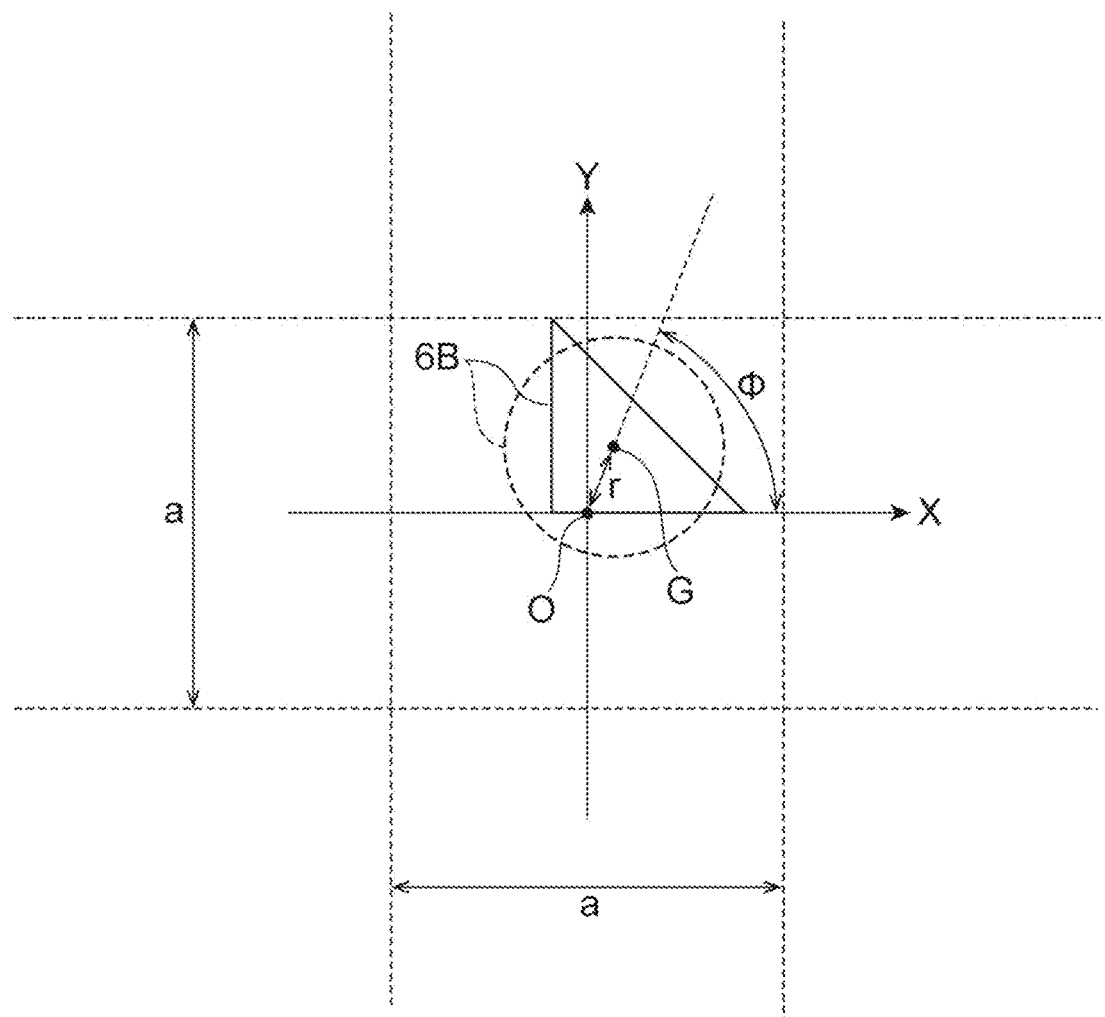
FIG. 7 is a view for explaining a shift amount from a lattice point position of a different refractive index region.

FIG. 7 is a view for explaining a shift amount from a lattice point position of a different refractive index region.

In the same figure, illustrated are cases where a planar shape of the different refractive index region 6B is a right triangle (solid lines) and where it is a circle (dotted line). The coordinates of one lattice point in an XY plane are provided as O, a lattice spacing in the X direction is provided as a, and a lattice spacing in the Y direction is also provided as a. In this case, the centroid position G of the different refractive index region 6B is shifted by a distance r in a direction of an angle φ from the coordinates O of the closest lattice point. In other words, the centroid G is on a circumference with a radius r centered on the lattice point position of a square lattice, and is at a position that is rotated by the angle φ.

Figure 8:
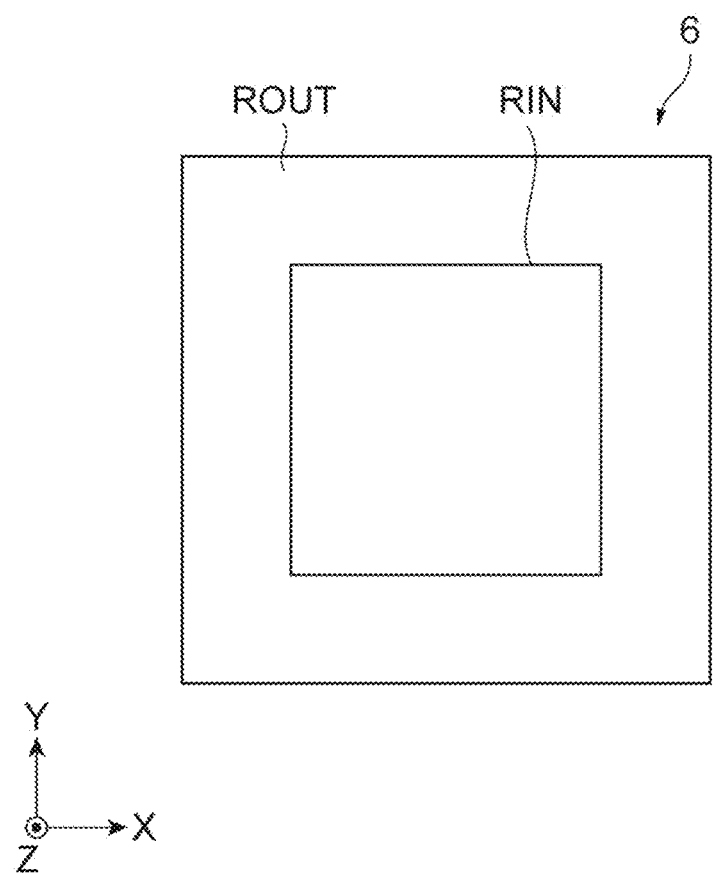
FIG. 8 is a plan view of the phase modulation layer.

FIG. 8 is a plan view of the phase modulation layer.

As shown in the same plan view, inside of a square inner region RIN, a substantially periodic structure (e.g.: structure in FIG. 6) for emitting an objective beam pattern is formed. On the other hand, in an outer region ROUT surrounding the inner region RIN, at lattice point positions of a square lattice, different refractive index regions whose centroid positions are coincident therewith are disposed. Shapes of the different refractive index regions in the outer region ROUT can be the same as those of the different refractive index regions in the inner region RIN. Moreover, for example, the filling factor FF in the outer region ROUT is set to 20%. Both inside the inner region RIN and within the outer region ROUT, the lattice spacing of a virtually set square lattice is the same (=a).

In a case of this structure, due to light also distributing into the outer region ROUT, there is an advantage that occurrence of high-frequency noise (so-called window function noise) which is produced by a sudden change in light intensity can be suppressed.

FIG. 9A, FIG. 9B, FIG. 9C and FIG. 9D includes views for explaining a far-field pattern.

A laser light output from the laser element LD forms a far-field pattern, which is a pattern of a near-field pattern subjected to Fourier transform. The laser light output in the Z-axis direction from an XY plane (light emitting surface) of the laser element LD has, at the position of a far-field pattern in FIG. 9A, a spot pattern of FIG. 9D. For having this spot pattern, as shown in the imaginary view of FIG. 9C, it suffices to have a phase distribution that is obtained when a complex angle distribution of this pattern is subjected to inverse Fourier transform, at the light emitting surface of the laser element LD. For obtaining this phase distribution, as shown in FIG. 9B, it suffices to set the rotation angle φ (refer to FIG. 7) of the different refractive index region 6B in the phase modulation layer 6 according to the coordinates.

Next, description will be given of an intensity pattern in a reciprocal lattice space of the phase modulation layer. In the following, an X-axis and a Y-axis are set in the reciprocal lattice space, but these axes both take a wave number of $(2\pi/a)$ as the unit, and can be provided as a Γ-X direction and a Γ-Y direction in a Brillouin zone of crystal engineering.

Figure 10:
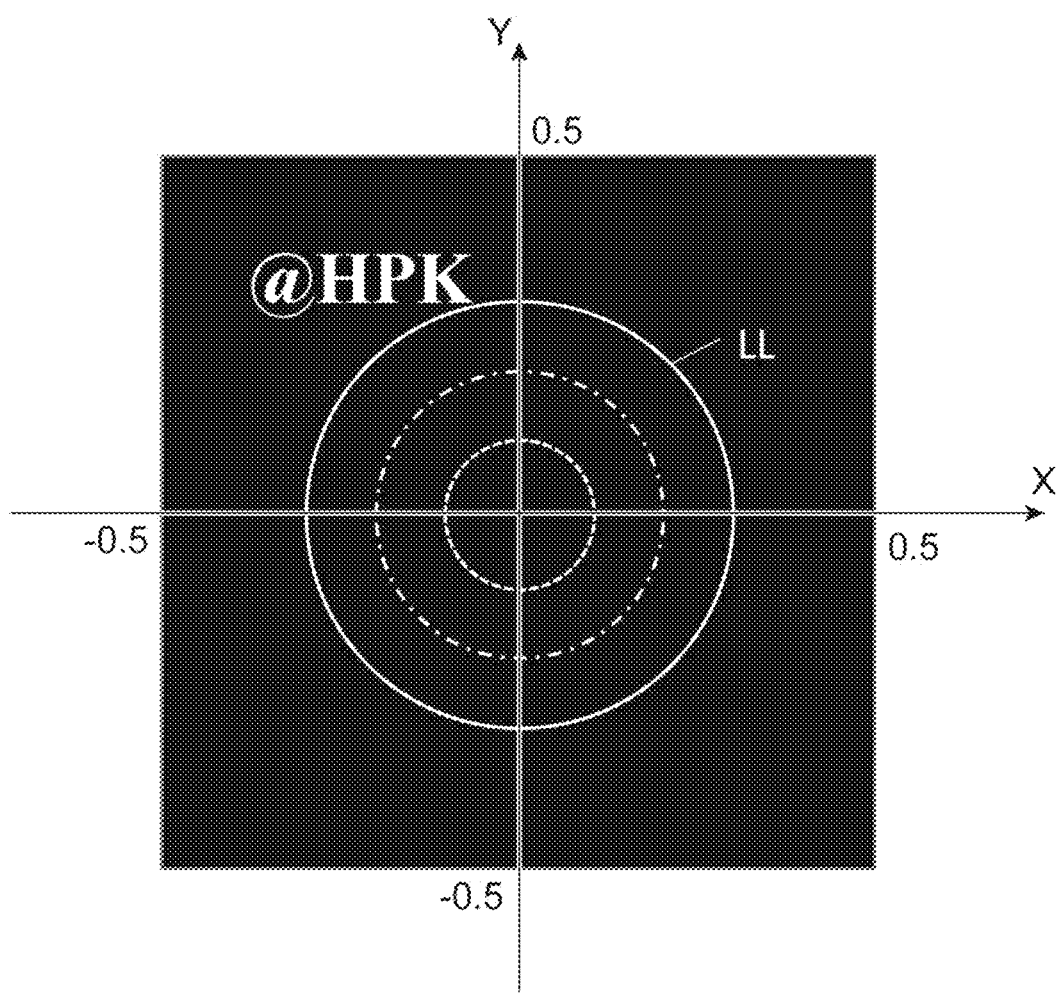
FIG. 10 is a view illustrating a pattern (working example) in a reciprocal lattice space.

FIG. 10 is a view illustrating a pattern (working example) in a reciprocal lattice space.

The alternate long and short dashed line on the inner side of the light line LL represents a wave number when an emission angle of laser light is 45°, and the dotted line represents a wave number when the emission angle of laser light is 20°. A character string (pattern) of "@HPK" is set outside the light line LL. A figure (in this example, a character string) in a reciprocal lattice space corresponds to a figure that is displayed in a far-field pattern. Because this figure (character string) exists outside the light line LL, the emission angle of laser light exceeds a total reflection critical angle, and nothing is displayed in an actual far-field pattern.

A reciprocal lattice space is also called a wave number space. An intersection (center position) between the X-axis and the Y-axis in the reciprocal lattice space has a wave number of 0, and this corresponds to a direction perpendicular to a light emitting surface of a laser element. The position of a circular light line LL corresponds to a/λ. "a" represents lattice spacing (lattice constant), and "λ" represents a wavelength in air of laser light. All of the unnecessary design patterns exist on the outer side of the light line LL.

FIG. 11 is a view of a phase distribution of an optical image obtained by inverse Fourier transforming the pattern in FIG. 10.

A case with a phase of 0° is shown in black, and a case with a phase of $2\pi$ is shown in white. When such phase distribution is used and a complex amplitude distribution determined by applying an amplitude distribution (for example, assumed to be uniform across the entirety) is subjected to Fourier transform, a complex amplitude distribution of a far-field pattern is then obtained, and the square of this complex amplitude distribution corresponds to an intensity distribution of light.

Figure 12:
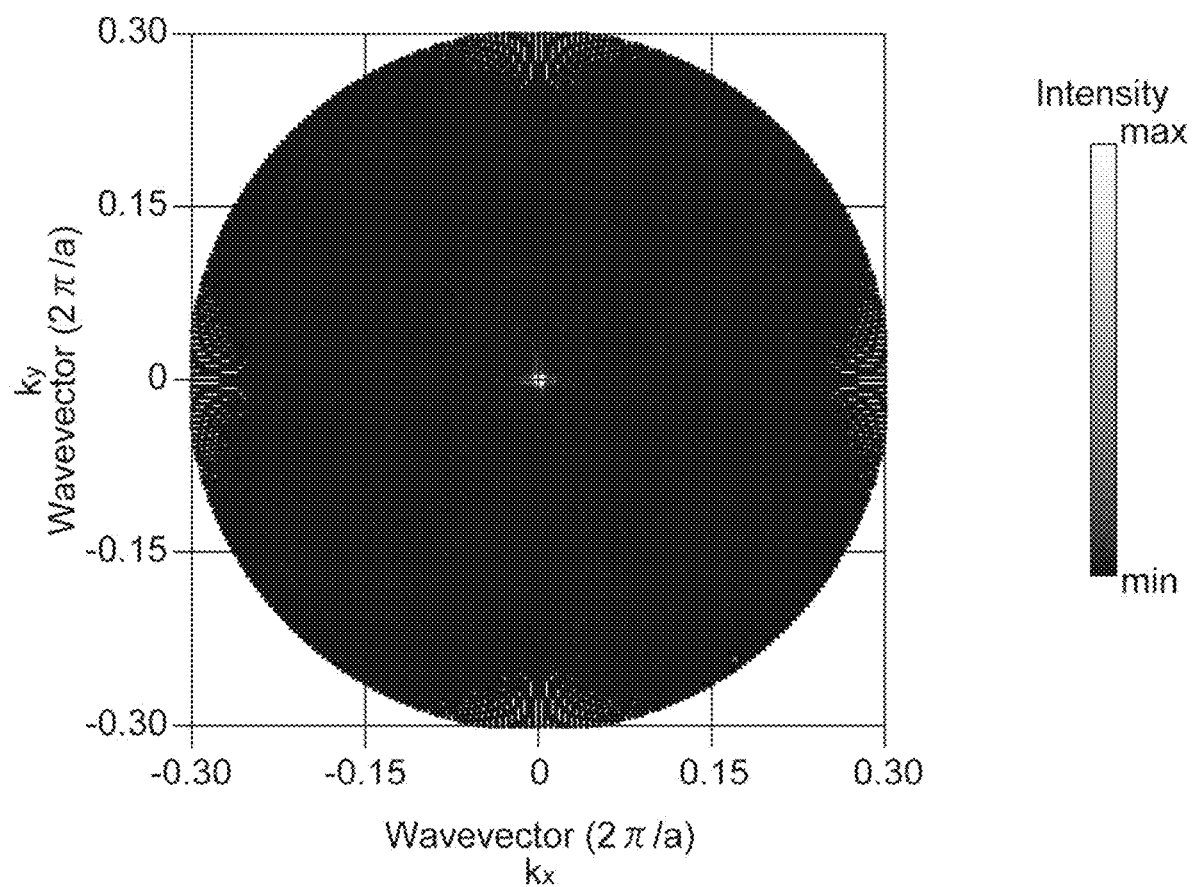
FIG. 12 is a view showing a far-field pattern actually obtained using the pattern in FIG. 11.

FIG. 12 is a view showing a directional dependence of an optical output actually obtained using the pattern of FIG. 11, which were measured across an upper hemisphere over a device and plotted on a wave number space. The same procedure as that described in the following document was used for plotting.

(Document) Kurosaka et al., "Effects of non-lasing band in two-dimensional photonic-crystal lasers clarified using omnidirectional band structure," Optics Express, Vol. 20, pp. 21773-21783, 2012.

This pattern was obtained by measuring an angle dependence of optical output across the entire upper hemisphere over the device in a case of a=284 nm, λ=940 nm, r=0.005a (specifically, 1.41 nm) and plotting the measurements on a wave number space, and a spot of 0-order light is observed at the center, but nothing other than the spot is observed. The drive current is 1 kHz/50 μs/1 A.

Figure 15:
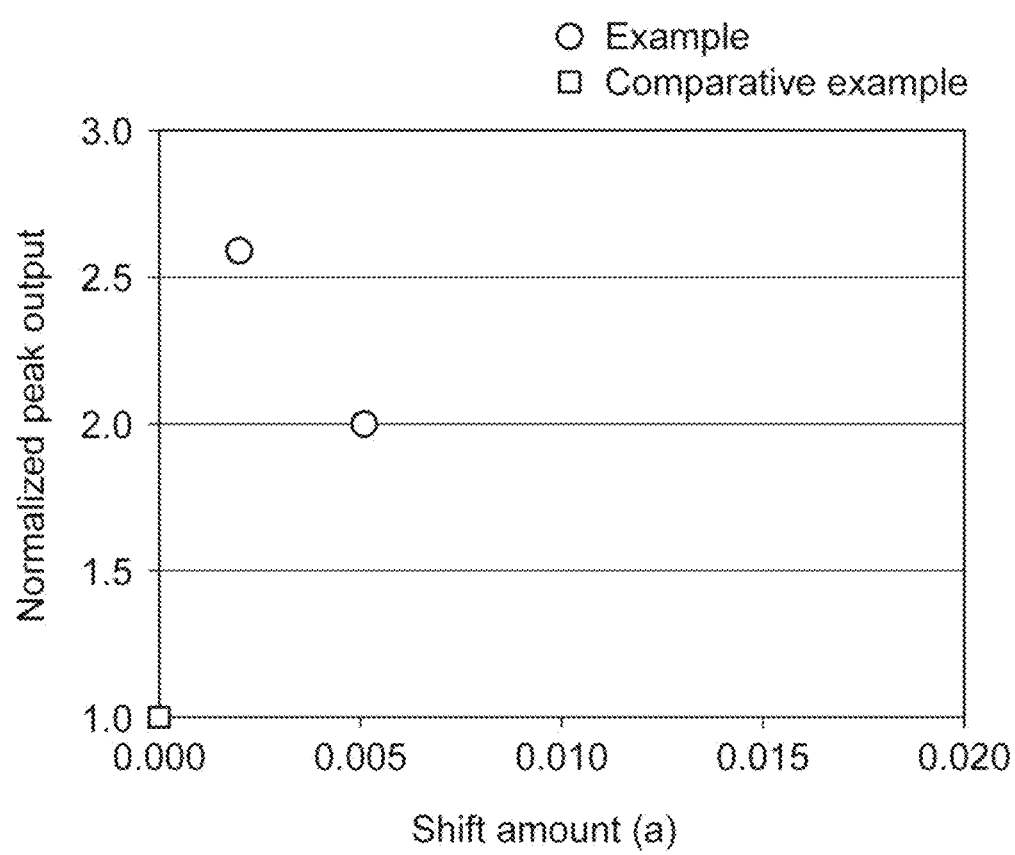
FIG. 15 is a graph showing a relationship between the shift amount from a lattice point position of a different refractive index region and the normalized peak output.

FIG. 13 is a table showing peak output data (in a case where the shape of different refractive index regions is an isosceles right triangle). FIG. 15 is a graph showing a relationship between the shift amount from a lattice point position of the different refractive index region and the normalized peak output, which is compiled from the data described in FIG. 13.

The laser element has the structure shown in FIG. 2, the lattice spacing a of a square lattice in the phase modulation layer is 284 nm, the electrode size at the top is 400 μm×400 μm, the drive current has a repetition frequency of 1 kHz, a pulse width of 50 ns, and a current value (maximum value) of 10 A, the length L of one side of the isosceles right triangle is 180 nm, and the area S of one isosceles right triangle is $L^2/2=16200$ nm$^2$.

The comparative example corresponds to a case where isosceles right triangle different refractive index regions were disposed so as to be coincident with the lattice points of a square lattice (shift amount r=0). This device is an ordinary phonic crystal laser, and only a spot in a perpendicular direction to the device surface (with a wave number of (0, 0) in a reciprocal lattice space) is output, and no figure (pattern) such as a character string is output. With a far-field pattern in this case, only the spot of 0-order light was observed, and the peak output of laser light was 3.3 W. The output in this case is normalized as 1.

Example 1 corresponds to a case where isosceles right triangle different refractive index regions were disposed so as to be shifted from the lattice points of a square lattice (shift amount r=0.002a), and in addition to a spot of 0-order light, the character string (@HPK) was included outside the light line in a reciprocal lattice space. With a far-field pattern in this case, only the spot of 0-order light was observed, the peak output of laser light was 6.7 W, and the normalized peak output was 2.03.

Example 2 corresponds to a case where isosceles right triangle different refractive index regions were disposed so as to be shifted from the lattice points of a square lattice (shift amount r=0.005a), and in addition to a spot of 0-order light, the character string (@HPK) was included outside the light line in a reciprocal lattice space. With a far-field pattern in this case, only the spot of 0-order light was observed, the peak output of laser light was 6.5 W, and the normalized peak output was 1.97.

In the cases described above, the shape of different refractive index regions is an isosceles right triangle, however, other shapes than this shape may be adopted. Specifically, besides isosceles triangles without right angles, even in large circular shapes with appropriate small circles disposed adjacent thereto so as to show shapes like quasi-isosceles triangles, ovals, and true circles, as long as an appropriate figure is disposed outside the light line, the intensity of spot light is considered to increase. As an example, description will be given in a case where the shape of different refractive index regions is a true circle.

Figure 16:
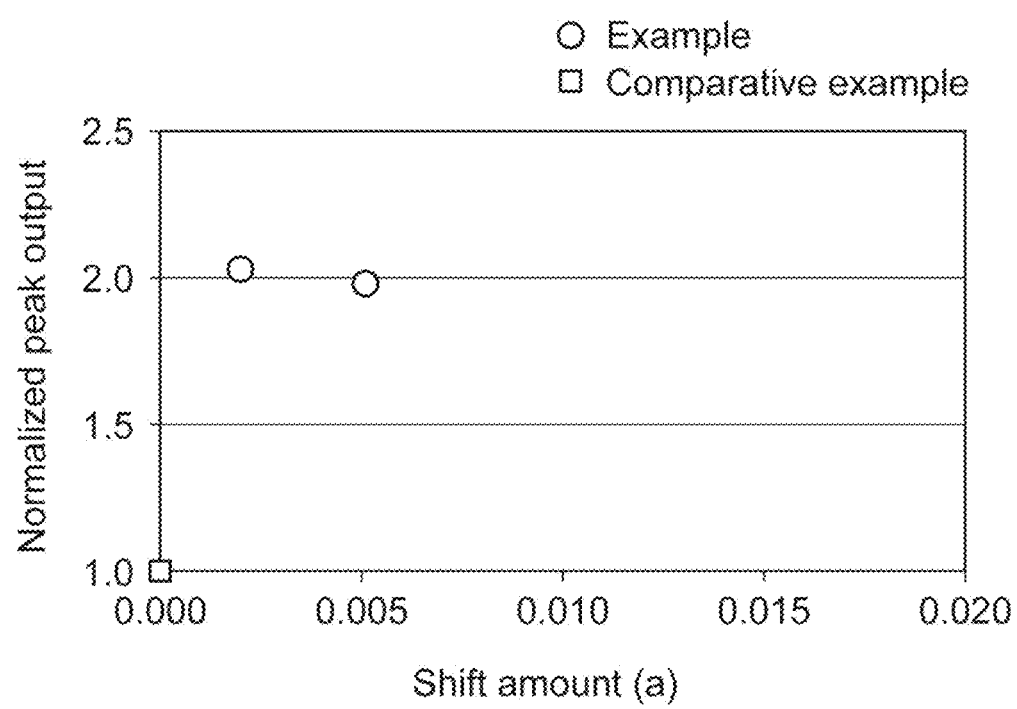
FIG. 16 is a graph showing a relationship between the shift amount from a lattice point position of a different refractive index region and the normalized peak output.

FIG. 14 is a table showing peak output data (in a case where the shape of different refractive index regions is a true circle). FIG. 16 is a graph showing a relationship between the shift amount from a lattice point position of the different refractive index region and the normalized peak output, which is compiled from the data described in FIG. 14.

The laser element has the structure shown in FIG. 2, the lattice spacing a of a square lattice in the phase modulation layer is 284 nm, the electrode size at the top is 400 μm×400 μm, the drive current has a repetition frequency of 1 kHz, a pulse width of 50 ns, and a current value (maximum value) of 10 A, the diameter d of the true circle is 72 nm, and the area S of one true circle is $\pi d^2 = 16286$ nm².

The comparative example corresponds to a case where circular different refractive index regions were disposed so as to be coincident with the lattice points of a square lattice (shift amount r=0), only a spot of 0-order light was set in a reciprocal lattice space, and no figure (pattern) such as a character string was included. With a far-field pattern in this case, only the spot of 0-order light was observed, and the peak output of laser light was 1.8 W. The output in this case is normalized as 1.

Example 1 corresponds to a case where circular different refractive index regions were disposed so as to be shifted from the lattice points of a square lattice (shift amount r=0.002a), and in addition to a spot of 0-order light, the character string (@HPK) was included outside the light line in a reciprocal lattice space. With a far-field pattern in this case, only the spot of 0-order light was observed, the peak output of laser light was 4.7 W, and the normalized peak output was 2.61.

Example 2 corresponds to a case where circular different refractive index regions were disposed so as to be shifted from the lattice points of a square lattice (shift amount r=0.005a), and in addition to a spot of 0-order light, the character string (@HPK) was included outside the light line in a reciprocal lattice space. With a far-field pattern in this case, only the spot of 0-order light was observed, the peak output of laser light was 3.6 W, and the normalized peak output was 2.00.

As has been described above, the semiconductor light emitting element described above includes an active layer, a pair of cladding layers sandwiching the active layer, a phase modulation layer optically coupled to the active layer, in which the phase modulation layer includes a basic layer, and a plurality of different refractive index regions that are different in refractive index from the basic layer, and when segments each connecting between centroid positions of the different refractive index regions adjacent closest to each other are defined and a smallest region enclosed by perpendicular bisectors of the segments is provided as each unit configuration region, the plurality of different refractive index regions are disposed so as to form a spreading pattern whose intensity is not 0 in a region that is inside a unit configuration region on a reciprocal lattice space in the phase modulation layer and is outside a light line, and the intensity of spot light can be increased without emitting light to become noise.

Moreover, in the semiconductor light emitting element described above, when an XYZ orthogonal coordinate system having a thickness direction of the phase modulation layer as a Z-axis direction is set and a virtual square lattice with a lattice constant a is set in an XY plane, each of the different refractive index regions is disposed so that its centroid position is shifted from a lattice point position in the virtual square lattice by a distance r, and the distance r is $0 < r \leq 0.01a$ (Example 1 and Example 2). In this case, the output of the semiconductor light emitting element was exponentially increased.

Moreover, in the case where r was $0 < r \leq 0.005a$ (Example 1 and Example 2), the output of the semiconductor light emitting element was further exponentially increased.

Moreover, in the case where r was $0.002a \leq r$ (Example 1), compared with the case where r=0, the output of the semiconductor light emitting element was further drastically increased.

As described above, in order to obtain a specific beam pattern, a phase is extracted from a complex amplitude obtained by inverse Fourier transforming the beam pattern, and the holes are disposed in a direction of an angle q according to this phase. The spot-like pattern at the center corresponds to a remaining light "0-order light" that was not modulated. The above-described beam pattern (characters of @HPK) and the like are patterns that are not used in actual laser devices, and are therefore called "unnecessary patterns."

The ratio of intensity of 0-order light and light of an unnecessary pattern changes according to the shift amount r of the different refractive index region in the phase modulation layer. When the shift amount r is great, the output of light of an unnecessary pattern increases, and when the shift amount r is small, the ratio of intensity of 0-order light increases.

As described above, the semiconductor light emitting element (semiconductor laser element) described above is a semiconductor laser element including an active layer, a pair of cladding layers sandwiching the active layer, and a phase modulation layer optically coupled to the active layer, in which the phase modulation layer includes a basic layer and a plurality of different refractive index regions that are different in refractive index from the basic layer, when an XYZ orthogonal coordinate system taking a thickness direction of the phase modulation layer as a Z-axis is set and a virtual square lattice with a lattice constant a is set in an XY plane, a centroid position G of each different refractive index region 6B is disposed on a circumference with a radius r centered on a lattice point position of the virtual square lattice, r is preferably $0 < r \leq 0.005a$, and in a case where, at an (X, Y)-th lattice point in the virtual square lattice, an angle created by a segment that connects the lattice point position of the square lattice and a centroid position of a different refractive index region with an X-axis direction is φ(X, Y), when a distribution function across the whole different refractive index region is set as A(X, Y) and $I(X, Y) = A(X, Y) \times \exp(j \times \varphi(X, Y))$ is provided by using "j" representing an imaginary unit, in terms of an intensity distribution of a complex amplitude distribution that is obtained by two-dimensional Fourier transforming I(X, Y), where an oscillation wavelength is provided as λ, a region (the "unnecessary pattern") of the complex amplitude distribution whose intensity is not 0 exists on the outer side of a circle (light line) with a radius a/λ when the complex amplitude distribution is disposed such that the Z-axis is at the center in the complex amplitude distribution.

Where coordinates in the XY plane are provided as (x, y) and it is assumed that i(x, y) represents an intensity distribution of light observed at an image plane of a far-field pattern, a complex amplitude distribution F(x, y) of light is given by:

$$i(x,y) = |F(x,y)|^2.$$

By inverse Fourier transforming the complex amplitude distribution F(x, y) of light in a far field, a complex amplitude distribution (phase distribution) I(x, y) at the light emitting surface (exit pupil plane) can be determined. When determining a complex amplitude distribution (complex amplitude of each unit configuration region) from a desired optical image, by applying an iterative algorithm such as the Gerchberg-Saxton (GS) method, which is commonly used at the time of calculation for hologram generation, reproducibility of a beam pattern is improved.

In the method described above, when a design far-field pattern exists, a phase φ as a rotational position of a different refractive index region 6B is made to coincide with a complex amplitude distribution (phase distribution) obtained in a case of inverse Fourier transform (two-dimensional inverse Fourier transform) applied to the far-field pattern. Where the shape of the different refractive index region 6B is an isosceles right triangle, an intense electric field is provided along the hypotenuse, and the mode of laser light is stabilized, but the optical output can be increased, and in a case where the shape of the different refractive index region 6B is a circle as well, the optical output can also be increased.

In addition, the pattern described above is a far-field pattern obtained by two-dimensional Fourier transforming a two-dimensional field intensity pattern distribution on an actual space formed on a light emitting surface parallel to an XY plane in the phase modulation layer, and each of the complex amplitudes of the electromagnetic fields f (x, y) of light obtained by two-dimensional inverse Fourier transforming the far-field pattern is, where an imaginary unit is provided as j, an amplitude term is provided as A(x, y), and a phase term is provided as P(x, y), given by:

$$f(x,y)=A(x,y)\times \exp[jP(x,y)],$$

segments each connecting between centroid positions of the different refractive index regions adjacent closest to each other are defined, and a smallest region enclosed by perpendicular bisectors of the segments corresponds to each unit configuration region, and in each of the unit configuration regions, an angle φ created by a segment that connects a centroid position of the different refractive index region and a lattice point position with an X-axis is, where a proportionality constant is provided as C, and constant number is provided as B, given by:

$$\varphi(x,y)=C\times P(x,y)+B.$$

This far-field pattern is composed of a plurality of image regions (the image regions are sometimes expressed by the same reference $FR(k_x, k_y)$ as the electromagnetic field of light for the reason of expediency) at coordinates ($k_x, k_y$) in a wave number space for which a two-dimensional field intensity pattern distribution on an actual space is subjected to two-dimensional Fourier transform, and the image regions providing the electromagnetic fields $FR(k_x, k_y)$ of light, each of which has a square shape, are two-dimensionally arranged so that M2 (M2 is an integer not less than 1) image regions are arrayed in a Kx-axis direction to give a normalized wave number $k_x$ in a wave number space, and in a Ky-axis direction to give a normalized wave number $k_y$, N2 (N2 is an integer not less than 1) image regions are arrayed, and the two-dimensional inverse Fourier transform to give the electromagnetic fields f(x, y) of light is given by the following formula.

$$f(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right] \quad \text{[Formula 2]}$$

Moreover, the orthogonal coordinate system described above can be transformed into a spherical coordinate system. Specifically, spherical coordinates (r, θtilt, θrot) representing coordinates (x, y, z) in an XYZ orthogonal coordinate system satisfy, with use of a length r of a radius, a tilt angle θtilt of the radius from a Z-axis, and a rotation angle θrot from the X-axis of a segment for which the radius is projected onto the XY plane, the following relationship.

$$x=r\cdot\sin\theta_{tilt}\cdot\cos\theta_{rot},$$

$$y=r\cdot\sin\theta_{tilt}\cdot\sin\theta_{rot}, \text{ and}$$

$$z=r\cdot\cos\theta_{tilt}.$$

Moreover, when a set of bright spots formed by a group of beams emitted at a tilt angle θtilt and a rotation angle θrot from the semiconductor light emitting element is provided as a far-field pattern, with the far-field pattern in a Kx-Ky plane, a normalized wave number $k_x$ on a Kx-axis and a normalized wave number $k_y$ on a Ky-axis satisfy the following relationship:

$$k_x=(a/\lambda)\cdot\sin\theta_{tilt}\cdot\cos\theta_{rot}, \text{ and}$$

$$k_y=(a/\lambda)\cdot\sin\theta_{tilt}\cdot\sin\theta_{rot}$$

where an oscillation wavelength of the semiconductor light emitting element is provided as λ.

A far-field pattern to be projected from the semiconductor laser element corresponds to a near-field pattern subjected to two-dimensional Fourier transform as described above, and when a far-field pattern in which a pattern is also formed outside the light line is subjected two-dimensional inverse Fourier transform, a near-field pattern is obtained, and in order to obtain an objective near-field pattern, it thus suffices, in each unit component region, that an angle φ created by a segment connecting a centroid position of the different refractive index region and a lattice point position with the X-axis satisfies the range described above.

As above, with the semiconductor light emitting element according to the embodiment described above, the intensity of spot light can be increased without emitting light to become noise.

What is claimed is:

1. A semiconductor light emitting element comprising:
    an active layer;
    a pair of cladding layers sandwiching the active layer;
    a phase modulation layer optically coupled to the active layer, wherein
    the phase modulation layer includes:
    a basic layer, and
    different refractive index regions that are different in refractive index from the basic layer,
    wherein unit configuration regions are two-dimensionally arranged in the phase modulation layer and include the different refractive index regions respectively,
    the different refractive index regions are disposed so as to form a spreading pattern whose intensity is not 0 in a region outside a light line in a reciprocal lattice space.

2. The semiconductor light emitting element according to claim 1, wherein
    when an XYZ orthogonal coordinate system taking a thickness direction of the phase modulation layer as a Z-axis direction is set and a virtual square lattice with a lattice constant a is set in an XY plane,
    each of the different refractive index regions is disposed so that its centroid position is shifted from a lattice point position in the virtual square lattice by a distance r, and
    the distance r is 0<r≤0.005a.

3. The semiconductor light emitting element according to claim 2, wherein
the distance r is 0.002a≤r.

4. The semiconductor light emitting element according to claim 1, wherein
the pattern is
a far-field pattern obtained by two-dimensional Fourier transforming a two-dimensional field intensity pattern distribution on an actual space formed on a light emitting surface parallel to an XY plane in the phase modulation layer, and
each of complex amplitudes of electromagnetic fields f(x, y) of light that is obtained by two-dimensional inverse Fourier transforming the far-field pattern is, where an imaginary unit is provided as j, an amplitude term is provided as A(x, y), and a phase term is provided as P(x, y), given by:

$f(x,y) = A(x,y) \times \exp[jP(x,y)]$, in each of the unit configuration regions, an angle (φ created by a segment that connects a centroid position of the different refractive index region and a lattice point position with an X-axis is, where a proportionality constant is provided as C, and a constant number is provided as B, given by:

$\varphi(x,y) = C \times P(x,y) + B$.

5. The semiconductor light emitting element according to claim 4, wherein
the far-field pattern is composed of a plurality of image regions at coordinates $(k_x, k_y)$ in a wave number space for which a two-dimensional field intensity pattern distribution on an actual space is subjected to two-dimensional Fourier transform, the complex amplitudes of the electromagnetic fields of light in the respective image regions are defined by $FR(k_x, k_y)$, each of the image regions providing the electromagnetic fields $FR(k_x, k_y)$ of light has a square shape, the image regions are two-dimensionally arranged so that M2 (M2 is an integer not less than 1) image regions are arrayed in a Kx-axis direction to give a normalized wave number $k_x$ in a wave number space, and in a Ky-axis direction to give a normalized wave number $k_y$, N2 (N2 is an integer not less than 1) image regions are arrayed, and
the two-dimensional inverse Fourier transform to give the complex amplitudes of the electromagnetic fields f(x, y) of light is given by the following formula:

$$f(x, y) = \sum_{k_x=0}^{M2-1} \sum_{k_y=0}^{N2-1} FR(k_x, k_y) \exp\left[j2\pi\left(\frac{k_x}{M2}x + \frac{k_y}{N2}y\right)\right].$$

6. The semiconductor light emitting element according to claim 5, wherein
spherical coordinates (r, θtilt, θrot) representing coordinates (x, y, z) in an XYZ orthogonal coordinate system satisfy, with use of a length r of a radius, a tilt angle θtilt of the radius from a Z-axis, and a rotation angle θrot from the X-axis of a segment for which the radius is projected onto the XY plane, the following relationship:

$x = r \sin\theta_{tilt} \cos\theta_{rot}$, $y = r \sin\theta_{tilt} \sin\theta_{rot}$, and $z = r \cos\theta_{tilt}$, and when a set of bright spots formed by a group of beams emitted at a tilt angle θtilt and a rotation angle θrot from the semiconductor light emitting element is provided as a far-pattern pattern,
with the far-field pattern in a Kx-Ky plane, a normalized wave number $k_x$ on a Kx-axis and a normalized wave number $k_y$ on a Ky-axis satisfy the following relationship:

$k_x = (a/\lambda) * \sin\theta_{tilt} \cos\theta_{rot}$, and $k_y = (a/\lambda) \sin\theta_{tilt} \sin\theta_{rot}$ where an oscillation wavelength of the semiconductor light emitting element is provided as λ.

* * * * *